United States Patent [19]

Kaganowicz et al.

[11] 4,361,595
[45] Nov. 30, 1982

[54] METHOD FOR PREPARING AN ABRASIVE LAPPING DISC

[75] Inventors: Grzegorz Kaganowicz, Princeton, N.J.; John W. Robinson, Levittown, Pa.

[73] Assignee: RCA Corporation, Princeton, N.J.

[21] Appl. No.: 229,150

[22] Filed: Jan. 28, 1981

[51] Int. Cl.³ .............................................. B05D 3/06
[52] U.S. Cl. ........................................ 427/39; 427/40
[58] Field of Search ............................ 427/39, 40, 41

[56] References Cited

U.S. PATENT DOCUMENTS

| | | | |
|---|---|---|---|
| 2,501,563 | 3/1950 | Colbert et al. | 427/39 |
| 3,068,510 | 12/1962 | Colman | 427/39 |
| 3,310,424 | 3/1967 | Wehner et al. | 427/41 |
| 3,626,517 | 12/1971 | Kurtz | 427/44 |
| 3,842,194 | 10/1974 | Clemens . | |
| 3,966,999 | 6/1976 | Horiguchi | 427/41 |
| 4,104,832 | 8/1978 | Kelzer | 360/122 |
| 4,162,510 | 7/1979 | Keizer | 358/128 |
| 4,252,838 | 2/1981 | Boord et al. | 427/40 |
| 4,260,647 | 4/1981 | Wang et al. | 427/41 |

FOREIGN PATENT DOCUMENTS 2302174  7/1974  Fed. Rep. of Germany ........ 427/41

Primary Examiner—John H. Newsome
Attorney, Agent, or Firm—Birgit E. Morris

[57] ABSTRACT

A method for preparing a plastic lapping disc overcoated with an abrasive silicon oxide layer. The method comprises the steps of introducing the silicon oxide precursors into an evacuated chamber containing the plastic lapping disc wherein a first major surface of the plastic disc is substantially covered during the glow deposition. The precursors are then subjected to a glow discharge. An abrasive silicon oxide layer is deposited on a second major surface of the disc opposite the first major surface.

16 Claims, 3 Drawing Figures

METHOD FOR PREPARING AN ABRASIVE LAPPING DISC

This invention relates to a method for preparing an abrasive lapping disc suitable for lapping video disc styli. More particularly, this invention relates to a method of preparing an abrasive lapping disc by a glow discharge deposition technique.

BACKGROUND OF THE INVENTION

U.S. Pat. No. 3,842,194 of Clemens discloses a capacitive information disc record having a playback system utilizing variable capacitance. In one configuration of the Clemens system, information representative of recorded picture and sound is encoded in the form of a relief pattern in a relatively fine spiral groove on the surface of a disc record. For example, groove widths of about 2.6 micrometers and groove depths of about 0.5 micrometer may be used. During playback a pickup stylus of about 2.0 micrometers wide having a thin conductive electrode thereon, for example, about 0.2 micrometer thick engages the groove as the record is rotating by a supportive turntable. Capacitive variations between the stylus electrode and the record surface are sensed to recover the pre-recorded information.

In systems of the above type, the use of a relatively fine record groove and the record engagement requirements of the pickup stylus result in a stylus tip which is extremely small.

In U.S. Pat. No. 4,162,510 of Keizer, a novel keel-tipped pickup stylus structure is disclosed. The keel-tipped pickup stylus comprises a dielectric support element having a body, a constricted terminal portion, and shoulders interconnecting the body with the constricted terminal portion. The electrode is remote from the keel tip.

A second patent of Keizer, U.S. Pat. No. 4,104,832, discloses a pyramidal dielectric support element which is shaped on an abrasive lapping disc having a deep, coarse-pitched groove in order to obtain a keel-tipped stylus. Glow discharge deposited $SiO_2$ is used by Keizer as an abrasive coating. The coating is prepared by a method which utilizes as starting materials oxygen and an alkoxy-substituted silane of the formula

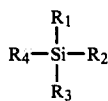

wherein $R_1$ is selected from the group consisting of H and $CH_3$, $R_2$ and $R_3$ are independently selected from the group consisting of H, $CH_3$, $OCH_3$, and $OC_2H_5$, and $R_4$ is selected from the group consisting of $OCH_3$ and $OC_2H_5$.

Coatings employed in Keizer require periods as long as 30 minutes to shape one diamond stylus. Furthermore, these coatings quickly loose their abrading ability and a second diamond stylus may require two hours to be lapped.

Kaganowicz is a copending application entitled, "METHOD FOR PREPARING AN ABRASIVE COATING", Ser. No. 963,819, filed Nov. 27, 1978, discloses a method for preparing an abrasive silicon oxide ($SiO_x$, $1 \leq x \leq 2$) coating on the substrate comprising glow discharging precursors comprising silane and a gaseous, oxygen-containing compound selected from the group consisting of $N_2O$, $H_2O$ and $CO_2$.

In preparing a lapping disc by glow discharge deposition methods a plastic disc is often employed as the substrate. Because a considerable amount of heat is generated during the glow discharge process, the glow discharge deposition must be interrupted to prevent the plastic substrate disc from warping. These interruptions lead to greater time requirements for preparing an abrasive lapping disc. It would therefore be desirable to have a method which allows for the preparation of an abrasive $SiO_x$ coating of suitable thickness without frequent interruption.

Wang et al. in a copending application entitled, "METHOD OF DEPOSITING AN ABRASIVE LAYER", Ser. No. 048,161, filed June 13, 1979, now U.S. Pat. No. 4,260,647 teach a method of depositing an $SiO_x$ layer onto a substrate by depositing a series of thin layers by glow discharge of an organosilane and oxygen. After each interruption of the deposition, a glow discharge is initiated in oxygen prior to a subsequent $SiO_x$ deposition. Because of the vigorous spontaneous interaction between $O_2$ and $SiH_4$ the Wang et al. method is not attractive for the present problem.

SUMMARY OF THE INVENTION

We have found a method for preparing a plastic lapping disc overcoated with an abrasive silicon oxide layer. The method comprises the steps of introducing the silicon oxide precursors into an evacuated chamber containing the plastic lapping disc wherein a first major surface of the plastic disc is substantially covered during the glow discharge deposition. The precursors are then subjected to a glow discharge. An abrasive silicon oxide layer is deposited on a second major surface of the disc opposite the first major surface.

DETAILED DESCRIPTION OF THE INVENTION

Figure 1:
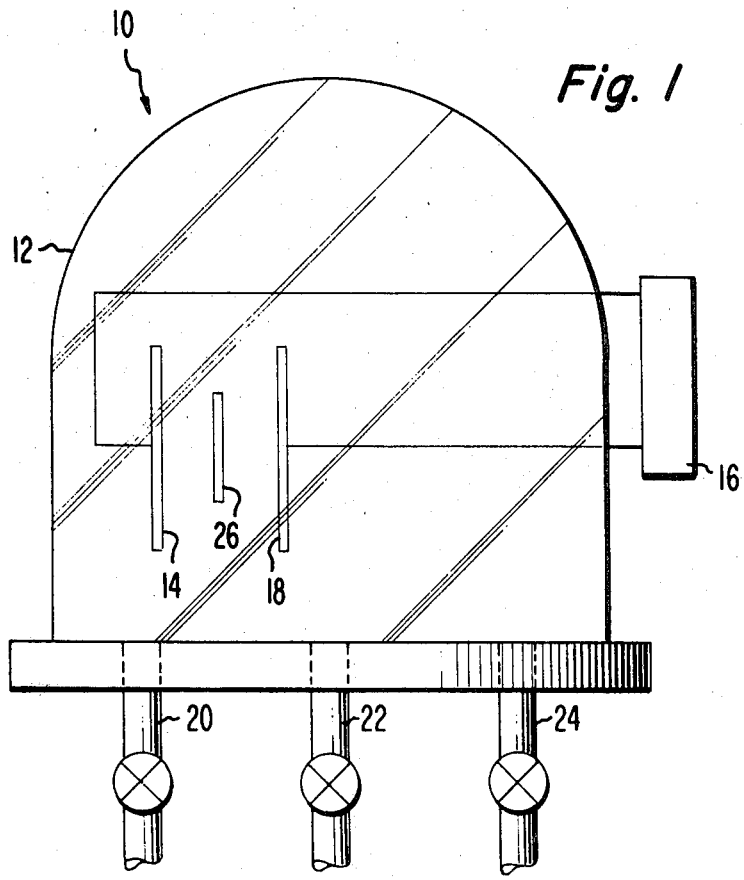
FIG. 1 is a cross-sectional view of an apparatus suitable for depositing the abrasive coating.

In this invention an abrasive silicon oxide ($SiO_x$, $1 \leq x \leq 2$) layer may be glow discharge deposited onto a plastic disc substrate for a longer period of time without warping by covering one major surface of the plastic disc with a second plastic disc, a metal sheet or any other convenient thermally conducting or nonconducting material. If a thermally nonconducting material such as a second plastic disc is employed, the nonconducting material serves to increase the thermal mass of the resulting assembly. Also, because only one side of the plastic disc is coated during the glow discharge process, less heat is built-up in the plastic disc. During the glow discharge coating process, the surface of the plastic disc is bombarded with hot particles so the shielding effect can be quite significant.

If a thermally conductive material such as a metal sheet is used to cover a major surface of the plastic disc, the thermally conductive material acts as a heat sink which draws off heat from the plastic disc generated during the glow discharge process. In addition, a metal sheet may act as a heat reflector so that some of the radiant heat may be deflected before it reaches the lapping disc.

During the glow discharge process the deposition generally continues until a desired thickness is reached. However, if a thick coating is required which causes the plastic disc material to approach its melting or relaxation temperature, then interruption of the glow discharge will still be required, albeit after considerably greater time than for an unprotected plastic disc.

The abrasive $SiO_x$ coating is preferably prepared by subjecting gaseous precursors to the glow discharge. Preferably, the precursors are $SiH_4$ and a gaseous oxygen containing compound such as $N_2O$, $H_2O$, or $CO_2$. More preferably, the oxygen containing compound is $N_2O$.

The present invention will be further described by means of the Drawing.

A glow discharge apparatus suitable for preparing the abrasive material is shown in FIG. 1 generally as 10. The glow discharge apparatus 10 includes a vacuum chamber 12 which is a glass bell jar. In the vacuum chamber 12 are two electrodes 14 and 18 which can be a screen, coil, or plate of a material that is a good electrical conductor and does not readily sputter, for example, aluminum. The electrodes 14 and 18 are connected to a power supply 16 which may be DC or AC. Thus, there will be a voltage potential between the electrodes 14 and 18. The plasma may be enhanced by means of magnets on the electrodes 14 and 18. An outlet 20 into the vacuum chamber 12 allows for evacuation of the system and is connected to a mechanical pump, not shown. First inlet 22 and second inlet 24 are connected to gas bleed systems, not shown, for adding the reactants employed to prepare the abrasive material.

In carrying out the process, a substrate 26 to be coated is placed between the electrodes 14 and 18 typically maintained about 5 to 10 centimeters apart. The vacuum chamber 12 is then evacuated through the outlet 20 to a pressure of about $0.5-1 \times 10^{-5}$ torr. A gas which acts as a source of oxygen is added through first inlet 22 to its desired partial pressure. $SiH_4$ is added through second inlet 24 until the desired partial pressure ratio of $SiH_4$ to the oxygen source is obtained.

In order to begin deposition of an abrasive coating on the substrate 26, a glow discharge is initiated between the electrodes 14 and 18 by energizing the power source 16. For deposition the current should be in the range of 200 to 900 milliamps, preferably 400 to 700 milliamps. Any convenient frequency such as 10 kilohertz may be employed. The potential between electrodes 14 and 18 is generally about 1,000 volts.

Figure 2:
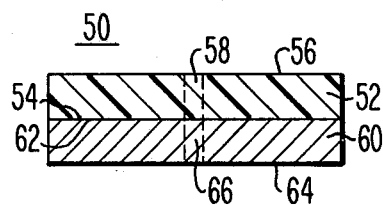
FIG. 2 is a schematic side view of a first assembly which includes a disc and a metal sheet.

FIG. 2 is a schematic side view of a first assembly 50. Included in the first assembly 50 is a first plastic disc 52 having a first major surface 54, a second major surface 56 and a first center hole 58. Also included in the first assembly 50 and adjacent to the first plastic disc first major surface 54 is a metal sheet 60 having the same diameter as the first plastic disc 52. A metal sheet first side 62 contacts the first plastic disc first major surface 54. A metal sheet second side 64 is exposed to the glow discharge deposition as is first plastic disc second major surface 56. The metal sheet 60 has a second center hole 66 which is aligned with the first center hole 58 to allow the first assembly to be placed between the two electrodes 14 and 18, respectively, of the glow discharge apparatus 10 as the substrate 26. The first assembly 50 may be held in place as the substrate 26 in the glow discharge apparatus 10 by any convenient means. Preferably, the means allows the first assembly to rotate about its axis and passes through the first center hole 58 and the second center hole 66. Although a metal sheet 60 is shown, the first plastic disc first major surface 54 may be covered by any convenient article such as a second plastic disc.

Figure 3:
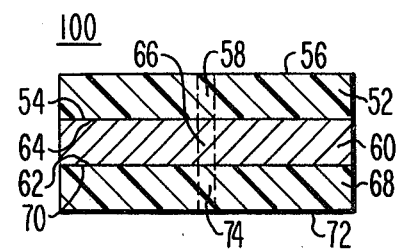
FIG. 3 is a schematic side view of a second assembly which includes two discs and a metal sheet.

FIG. 3 is a schematic side view of a second assembly 100. In addition to the first plastic disc 52 and the metal sheet 60 shown in FIG. 2, the second assembly 100 includes a second plastic disc 68 having the same radial dimensions as the first plastic disc 52. A second plastic disc first major surface 70 is in contact with the metal sheet second side 64. A second plastic disc second major surface 72 is exposed. The second plastic disc record 68 has a third center hole 74 which is in alignment with the first center hole 58 and second center hole 66. The second assembly 100 is placed between the two electrodes 14 and 18 in the glow discharge apparatus 10 as the substrate 26 and may be held in place by the same means employed for the first assembly 50. In the second assembly 100, one major surface of each of two plastic discs may be coated in a single glow discharge deposition.

The plastic disc may be fabricated out of any convenient material such as a homopolymer or copolymer of vinyl chloride or styrene. The metal sheet may be any suitable material such as about 1/16 to ⅛ in. (1.6 to 3.2 millimeters) thick aluminum. The plastic disc major surfaces can be coated with one or more metal layers prior to silicon oxide glow discharge deposition. Metal layers such as copper and Inconel 600 (76.8 atom percent nickel, 13.8 atom percent chromium and 8.5 atom percent iron) are preferred.

This invention will be further illustrated by means of the following Examples, but it is to be understood that the invention is not meant to be limited by the details described therein.

EXAMPLE 1

Two 12-inch (30.5 cm) diameter plastic discs containing a deep, continuous trapazoidal groove in each major surface were placed on each side of a 14-inch (35.6 cm) diameter 0.07-inch (1.78 mm) thick aluminum disc. The plastic disc was compression molded from a molding composition which included 95.25 percent by weight Geon 110×346 (a homopolymer of vinyl chloride available from B. F. Goodrich Co. having a weight averaged molecular weight of 46,200, a number averaged molecular weight of 23,300 and a $T_g$ of 80° C.). The three discs were placed in a 46 cm×76 cm bell jar of a glow discharge apparatus as described in FIG. 1 which was then evacuated to $1 \times 10^{-5}$ torr.

$N_2O$ was added to a partial pressure of 32 micrometers of mercury using a flow rate of 23.6 standard cubic centimeters per minute (sccm).

A screw, two washers, and a nut were used to hold the assembly of the three discs in place in the glow discharge apparatus. The assembly was rotated at a rate of 30 revolutions per minute between two 15 cm×15 cm aluminum electrodes. These electrodes covered a strip approximately 6 cm wide on the disc. To create a glow between the electrodes, current was supplied to the electrodes at a rate of 500 milliamps with a potential of about 1,000 volts at 10 kHz.

The effect of the glow discharge process on the plastic discs is summarized in Table I.

TABLE I

| Time (minutes) | Condition of the plastic discs |
|---|---|
| 3 | no warping |
| 6 | no warping |
| 9 | no warping |
| 10.5 | starting to warp |
| 11 | warped beyond possible use |

Using the assembly, the glow discharge process could continue for at least 9 minutes before interruption to allow for plastic disc cooling.

Control 1

A vinyl disc, as described in Example 1, was placed in the glow discharge apparatus and subjected to the same glow discharge conditions of Example 1. The effect of the glow discharge process on the plastic disc is shown in Table II.

TABLE II

| Time (minutes) | Condition of the plastic discs |
|---|---|
| 1 | no warping |
| 2 | warped |
| 3 | warped beyond use |

These results indicate that in the absence of the metal sheet the glow discharge process must be interrupted about every 1–2 minutes.

EXAMPLE 2

The same assembly of aluminum discs and two plastic discs was employed as in Example 1, except that the molding composition contained 76 parts by weight of Geon 110×346 and 15 parts by weight of carbon black. The same glow discharge apparatus and conditions of Example 1 were employed. After $N_2O$ was added, $SiH_4$ was added at a rate of 3.3 sccm to a partial pressure of 4.3 micrometers of mercury. The effect of the glow discharge deposition on the plastic discs is shown in Table III for plastic discs coated with 50 angstroms of copper followed by 500 angstroms of Inconel 600.

TABLE III

| Time (minutes) | Condition of the plastic discs |
|---|---|
| 5 | no warping |
| 7 | no warping |
| 9.5 | started to warp |
| 10 | warped beyond use |

These results indicate that two interruptions would be required to deposit a 1,500 angstrom $SiO_x$ coating at a deposition rate of 75 angstroms/minute.

Control 2

The conditions and procedures of Example 2 were employed using a single plastic disc of the composition taught in Example 2. The effect of glow discharge deposition on the plastic discs is shown in Table IV.

TABLE IV

| Time (minutes) | Condition of the plastic discs |
|---|---|
| 2 | no warping |
| 4 | started to warp |
| 5.5 | warped beyond use |

The absence of the metal sheet of Example 2 causes warping to occur in about half the time during glow discharge deposition.

EXAMPLE 3

The same plastic discs and experimental conditions of Example 2 were employed to prepare $SiO_x$ coatings except as follows. $N_2O$ was added at a flow rate of 23.6 sccm to a partial pressure of 32 micrometers of mercury. $SiH_4$ was then added at a flow rate of 3.1 sccm to a partial pressure of 5 micrometers of mercury. The results are shown in Table V.

TABLE V

| Time to the Onset of Disc Warping (Seconds) | Time to Disc Warping Beyond Use (Seconds) | Assembly Employed | $SiO_x$ Thickness After Warping Beyond Use (Angstroms) | $SiO_x$ Refractive Index |
|---|---|---|---|---|
| 60 | 180 | 1 Plastic Disc | 258 | 1.379 |
| 180 | 480 | 2 Plastic Discs (back-to-back) | 548 | 1.365 |
| 600 | 620 | 2 Plastic Discs and Aluminum Sheet (as in Example 2) | 761 | 1.298 |

The refractive indeces and thicknesses were determined by ellipsometry. The results indicate that both the time before the onset of warping and warping beyond use were greatest when two plastic discs were placed on either side of an aluminum sheet. However, two plastic discs having a major surface of each disc overlying each other required three times as much exposure to the glow discharge deposition process to warp when compared to a single plastic disc.

We claim:

1. A method for preparing a coating on a heat sensitive substrate comprising the steps of:
    placing the substrate in a chamber having two spaced apart electrodes wherein the substrate is between, parallel to, and spaced apart from the two electrodes and wherein one major surface of the substrate is substantially covered by a separate covering article whose purpose is to substantially alleviate heat buildup on the substrate;
    introducing the appropriate precursors into the evacuated chamber; and
    subjecting the precursors to a glow discharge by means of the electrodes so as to deposit the desired coating on an uncovered surface of the substrate which is opposite the substantially covered major surface.

2. A method for preparing a plastic lapping disc overcoated with an abrasive silicon oxide layer comprising the steps of:
    placing a plastic disc in a chamber having two spaced apart electrodes wherein the plastic disc is between, parallel to, and spaced apart from the two electrodes and wherein one major surface of the plastic disc is substantially covered by a separate covering article whose purpose is to substantially alleviate heat buildup on the plastic disc;
    introducing the silicon oxide precursors into the evacuated chamber; and
    subjecting the precursors to a glow discharge by means of the electrodes so as to deposit an abrasive silicon oxide layer on an uncovered surface of the plastic disc which is opposite the substantially covered major surface.

3. A method in accordance with claim 2, wherein the covering article is a first side of a metal sheet.

4. A method in accordance with claim 3, wherein a major surface of a second plastic disc is substantially covered by a second side of the metal sheet.

5. A method in accordance with claims 3 or 4, wherein the metal sheet comprises aluminum.

6. A method in accordance with claim 2, wherein the precursors comprise $SiH_4$ and a gaseous oxygen-containing compound selected from the group consisting of $N_2O$, $H_2O$, and $CO_2$.

7. A method in accordance with claim 6, wherein the compound is $N_2O$.

8. A method in accordance with claim 2, wherein the plastic is a copolymer or homopolymer of vinyl chloride.

9. A method in accordance with claim 2, wherein the plastic is a copolymer or homopolymer of styrene.

10. A method for preparing a coating on heat sensitive substrates comprising the steps of:
placing in a chamber a first heat sensitive substrate and a second heat sensitive substrate which is in contact with the first substrate whereby one major surface of the first substrate and one major surface of the second substrate substantially cover each other;
introducing appropriate precursors into the evacuated chamber; and
subjecting the precursors to a glow discharge by means of two electrodes so as to deposit the desired coating on an uncovered surface of the first substrate which is opposite its substantially covered major surface.

11. A method in accordance with claim 10 wherein the first heat sensitive substrate and the second heat sensitive substrate are plastic.

12. A method in accordance with claim 11 wherein the plastic is a homopolymer or copolymer of vinyl chloride.

13. A method in accordance with claim 10 wherein the precursors comprise $SiH_4$ and a gaseous oxygen containing a compound selected from the group consisting of $N_2O$, $H_2O$ or $CO_2$.

14. A method in accordance with claim 13 wherein the gaseous oxygen-containing compound is $N_2O$.

15. A method in accordance with claim 10 wherein the plastic is a copolymer or homopolymer of styrene.

16. A method for preparing a plastic lapping disc overcoated with an abrasive silicon oxide layer comprising the steps of:
placing a first plastic disc in a chamber having two spaced apart electrodes wherein the first plastic disc is between, parallel to, and spaced apart from the electrodes and wherein one major surface of the first plastic disc is substantially covered by a second plastic disc whose purpose is to substantially alleviate heat buildup on the first plastic disc;
introducing the silicon oxide precursors into the evacuated chamber; and
subjecting the precursors to a glow discharge by means of the electrodes so as to deposit an abrasive silicon oxide layer on an uncovered surface of the first plastic disc which is opposite the substantially covered major surface.

* * * * *